United States Patent
Hayes et al.

(10) Patent No.: US 8,520,917 B2
(45) Date of Patent: Aug. 27, 2013

(54) METHOD AND DEVICE TO AUTOMATICALLY DETERMINE THE REST PHASE OF THE HEART

(75) Inventors: Carmel Hayes, Munich (DE); Katrin Christel Sprung, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 806 days.

(21) Appl. No.: 12/370,769

(22) Filed: Feb. 13, 2009

(65) Prior Publication Data

US 2009/0208083 A1  Aug. 20, 2009

(30) Foreign Application Priority Data

Feb. 15, 2008  (DE) .................. 10 2008 009 190

(51) Int. Cl.
*A61B 5/05*  (2006.01)
(52) U.S. Cl.
USPC ........................................................ 382/128
(58) Field of Classification Search
USPC .................. 382/128, 130, 131, 132; 600/425
See application file for complete search history.

(56) References Cited

U.S. PATENT DOCUMENTS

| | | | |
|---|---|---|---|
| 6,381,487 B1 * | 4/2002 | Flohr et al. ................... | 600/425 |
| 6,643,533 B2 * | 11/2003 | Knoplioch et al. ........... | 600/407 |
| 6,766,043 B2 * | 7/2004 | Zeng et al. ................... | 382/128 |
| 7,155,042 B1 * | 12/2006 | Cowan et al. ................. | 382/128 |
| 2002/0025017 A1 * | 2/2002 | Stergiopoulos et al. ......... | 378/8 |
| 2006/0241511 A1 | 10/2006 | Warmuth | |
| 2006/0291705 A1 * | 12/2006 | Baumann et al. ............. | 382/128 |

OTHER PUBLICATIONS

"A New Approach for Rapid Assessment of the Cardiac Rest Period for Coronary MRA," Jahnke et al, Journal of Cardiovascular Magnetic Resonance, vol. 7 (2005) pp. 395-399.
"Coronary MR Imaging: Breath-hold Capability and Patterns, Coronary Artery Rest Periods, and β-Blocker Use," Jahnke et al, Radiology, vol. 239, No. 1 (2006), pp. 71-78.

* cited by examiner

*Primary Examiner* — Thanh Luu
*Assistant Examiner* — Danell L Owens
(74) *Attorney, Agent, or Firm* — Schiff Hardin LLP

(57) ABSTRACT

In a method and device to automatically determine a rest phase of the heart of an examination person in an imaging device, multiple images of the heart are acquired during a cardiac cycle and the rest phase of the heart is automatically determined by post-processing of the acquired images, and the determined rest phase is used for subsequent measurements.

15 Claims, 3 Drawing Sheets

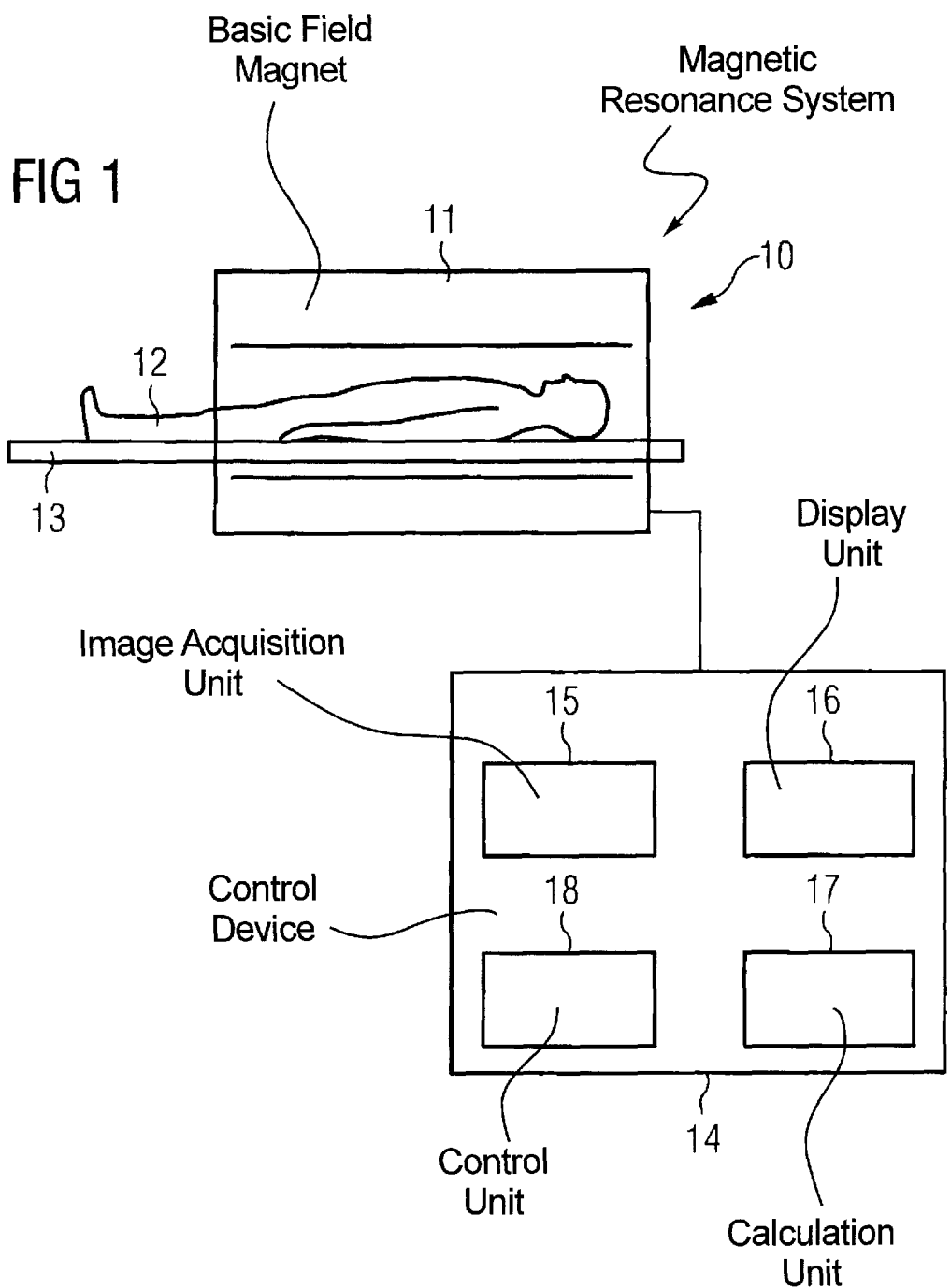

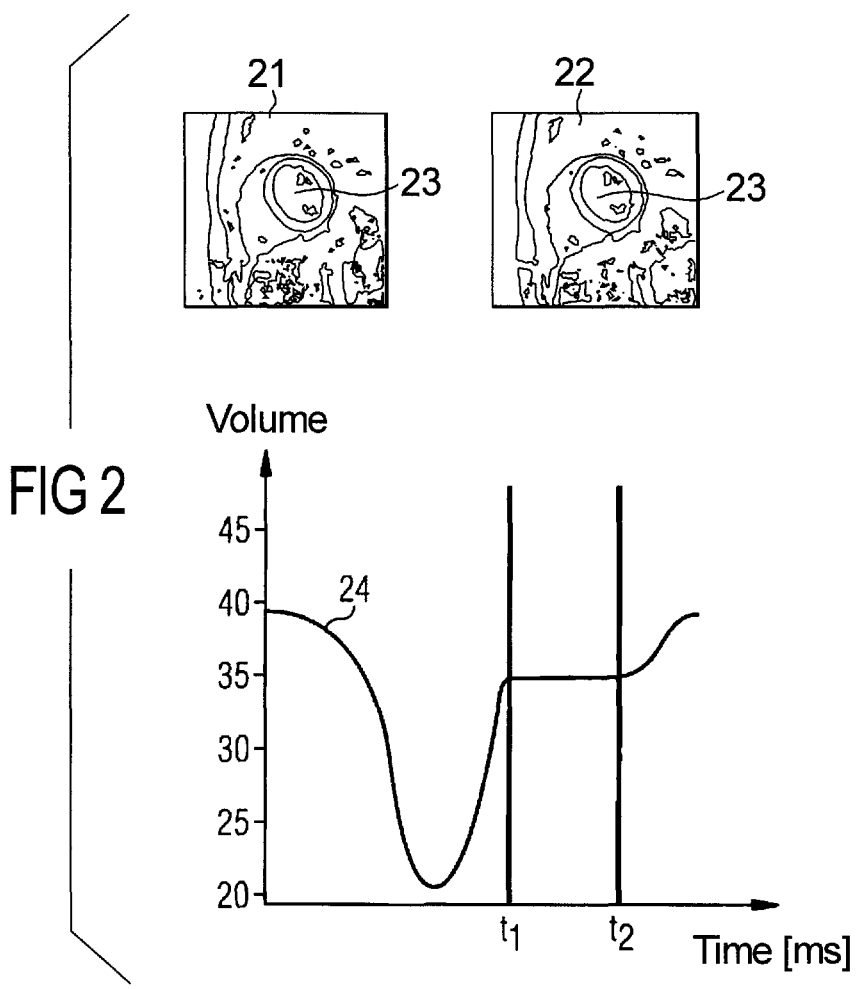
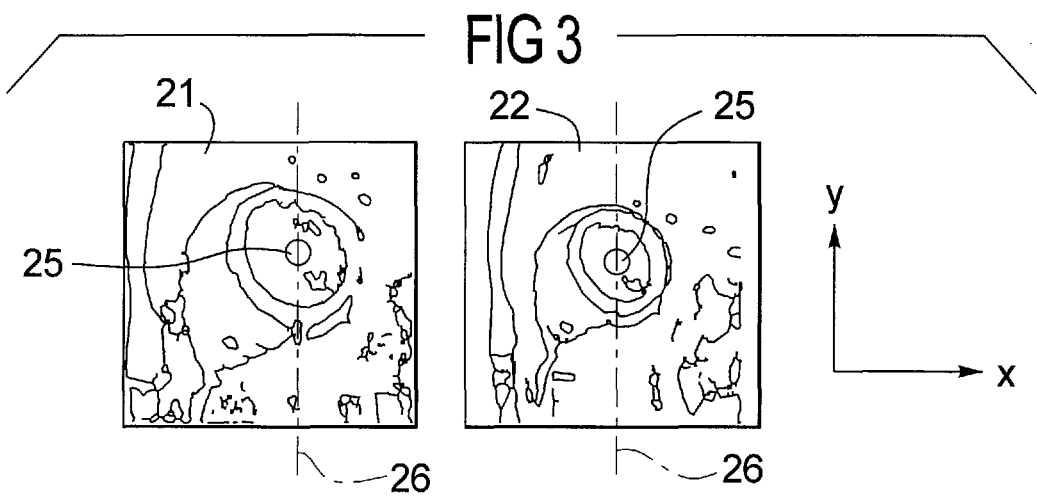

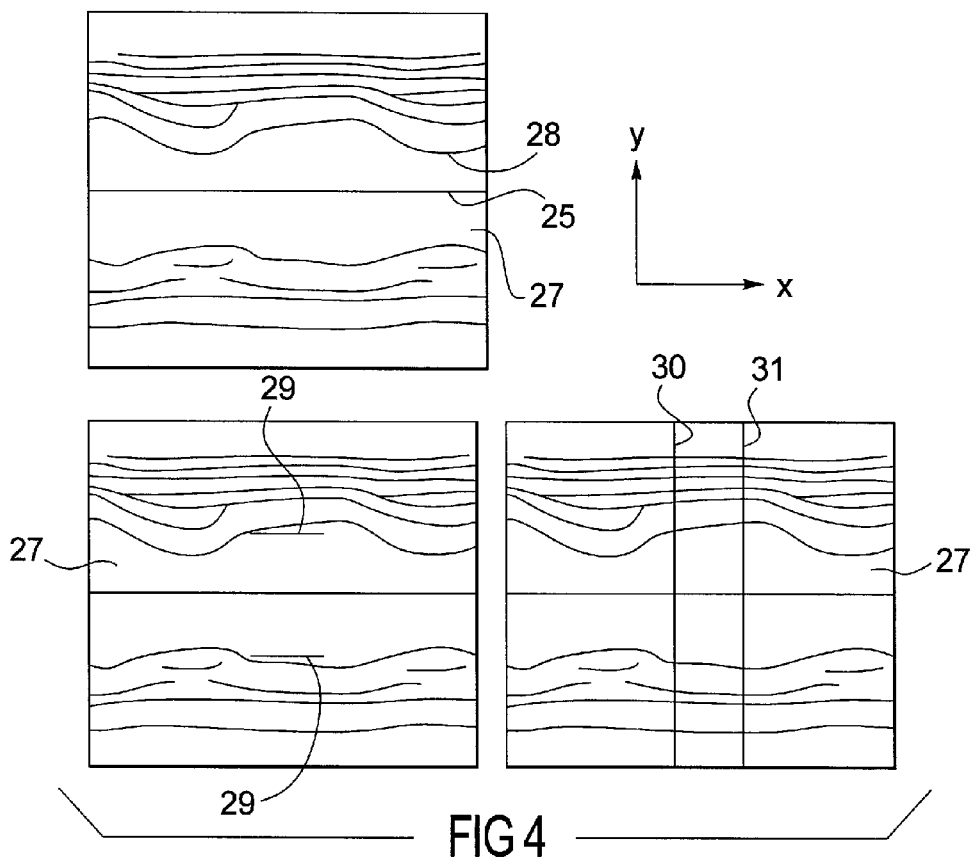
FIG 4
FIG 5
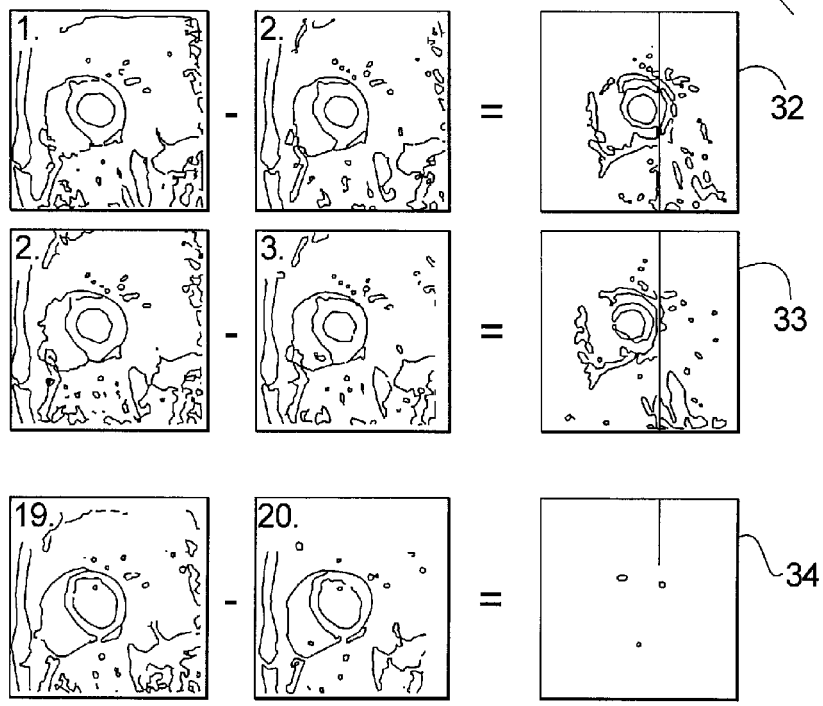

METHOD AND DEVICE TO AUTOMATICALLY DETERMINE THE REST PHASE OF THE HEART

BACKGROUND OF THE INVENTION

1. Field of the Invention

The present invention concerns a method to automatically determine a rest phase of the heart in an examined person in an imaging device. The invention is used in particular (but not exclusively) in magnetic resonance systems; however, it can also be used in other imaging devices.

2. Description of the Prior Art

Given some acquisitions of heart images—in particular in magnetic resonance (MR) imaging—it is necessary to acquire the exposures when the heart is not moving, thus is in the rest phase. The determination of when this point in time is in the cardiac cycle is crucial for the resulting image quality of the image exposure, wherein the rest phase in the cardiac cycle should be used for the acquisition of additional images of the heart.

In the prior art it is known to generate a type of film sequence of the heart activity via acquisition of multiple images of the heart during a cardiac cycle. The operator of the imaging device can view this film of the heart movement after the measurement and establish via visual analysis when the heart is located in the rest phase. The operator previously had to determine this rest phase in the images himself. The following errors can possibly occur in this determination:

First, it is possible that the time for the rest phase of the heart is not selected precisely enough by the operator. Second, it can occur that imaging parameters determined from the rest phase are incorrectly adapted for the subsequent heart measurement. This can lead to a poor image quality and make a repetition of the measurement necessary, whereby the examination time of the patient in the imaging device is unnecessarily extended.

SUMMARY OF THE INVENTION

An object of the present invention is to optimize the determination of the rest phase of the heart so that it is simple and less error-prone.

According to the invention, in a method or automatic determination of the rest phase, multiple images of the heart are acquired during the cardiac cycle and the rest phase of the heart is determined automatically based on the acquired images. Not only is the examination accelerated overall by the automatic determination of the rest phase, but potential sources of errors that the operator can make in the determination and transfer of the time spans for the rest phase to the subsequent measurements are also avoided.

According to a preferred embodiment, the images that show the starting point in time and the end point in time of the rest phase of the cardiac cycle are identified among the images acquired during the cardiac cycle, wherein the points in time which demarcate the rest phase of the heart in the current carrying capacity are determined by the acquisition point in time of the image at the starting point in time of the rest phase and the acquisition point in time of the image at the end point in time. Although the term "points in time" is used herein with regard to of in the acquisition of images, it is clear that the images (in particular MR images) cannot be acquired in an infinitesimally small time period, but magnetic resonance tomography acquisitions in the range of milliseconds are possible, such that use of "points in time" is appropriate. These points in time are demarcated relative to the time span that is the rest phase of the heart in the cardiac cycle.

If the rest phase of the heart was automatically determined, this can likewise be automatically transferred to a subsequent imaging sequence, wherein the imaging parameters of the subsequent imaging sequence are automatically adapted such that the images of the heart acquired in the subsequent imaging sequence are acquired in the rest phase of the heart. For example, the acquisition window, a trigger delay given EKG-triggered measurements or the number of the acquired segments during the rest phase can be adapted in the subsequent imaging sequence. In magnetic resonance tomography, segmented acquisition techniques are known in which the entirety of the raw data for an MR image is not acquired during a cardiac cycle, rather only segments of the raw data space. The length of the rest phase now influences the size of the segments that can be acquired during a cardiac cycle.

In a preferred embodiment, the images of the heart are acquired in a short axis slice. The short axis slice allows the systolic phase to be easily visibly differentiated from the diastolic phase. Naturally, other slice planes through the heart are also possible in order to automatically detect the rest phase via post-processing from the images present from these slice planes. For example, some of the possibilities cited in the following can also be detected [sic] given a long axis section through the heart.

One possibility to automatically determine the rest phase of the heart is to consider the images acquired during a cardiac cycle over time and to hereby examine a volume parameter of the heart, wherein the time span in which the volume parameter essentially remains constant in the images over time is defined as a rest phase. In one exemplary embodiment, the volume parameter is the volume of the endocardial region. The endocardial region can be well identified in the short axis slice, wherein the area presented in the image is, for example, a measure of the volume of the endocardial region. The rest phase during the diastole can then be concluded via examination of the area in the acquired MR image over time.

An additional possibility to determine the rest phase of the heart is to track the spatial position of a predetermined region in the heart over time of the acquired images during the cardiac cycle and to examine whether the spatial position of this region is essentially constant. One possibility that can in particular also be graphically represented is to generate for each acquired image a signal intensity cross-section through the image at a predetermined point and to examine this signal intensity cross-section over time. This cross-section should contain the predetermined region. If the position of this predetermine region changes only slightly over time, it can be concluded form this that the position of this region remains essentially unchanged over the cardiac cycle, whereby the rest phase of the heart can be concluded. One possibility for selection of the predetermined region is the selection of the boundary of the left ventricle of the heart. This can be identified in an image or in a cross-section in a simple manner, for example via segmentation. In the event that the position of the left ventricle remains essentially unchanged over time, the rest phase of the heart can be concluded. The position of the heart in the image should likewise be constant so that the position of the left ventricle is constant in the considered images over the cardiac cycle. For this it is possible to identify the position of a predetermined point in the heart (for example the cardiac center) in the images and to post-process the images such that—in the event that it is necessary—the predetermined point (such as the cardiac center) always lies at the same image coordinates over time. The images in which the ventricle boundaries are essentially constant over time can be identified as images that were acquired in the rest phase of the heart. The starting point in time and the end point in time of the rest phase that demarcate the time span that is advantageously used for the subsequent imaging can then be identified from the rest phase.

An additional possibility for automatic detection of the rest phase of the heart is the use of difference images of the acquired images. The movement that occurred between the acquisition of two images can be concluded via images of the difference from respective images acquired in succession. If the difference image or a predetermined region in the difference image contains only very low signal intensity, it can be concluded from this that the imaged heart was essentially at rest. For example, two images can be identified as images acquired during the rest phase when the signal intensity in a predetermined region of the difference image is less than a predetermined limit value, or if the shape of the heart in the difference image is no longer recognizable. The signal intensities in the image points of the considered region can be accumulated, but averaging is also possible. According to one embodiment, the starting points in time and the end points in time of the rest phase are respectively automatically determined and are used immediately as a basis for the calculation of imaging parameters of the additional heart imaging sequences, without review by the operator. In another embodiment, it is likewise possible to present the calculated starting and end points in time to the operator so that he can review the calculation and can change the points in time as necessary.

The invention likewise concerns an imaging device as described above that has an image acquisition unit to acquire multiple images of the heart during the cardiac cycle. Furthermore, a calculation unit is provided that automatically calculates the rest phase of the heart via post-processing of the acquired images. The calculated values can be presented on a display unit for the operator.

BRIEF DESCRIPTION OF THE DRAWINGS

FIG. 1 schematically illustrates an MR system with automatic calculation of the rest phase in the cardiac cycle.

FIG. 2 shows images for a calculation of the rest phase with the use of the endocardial volume.

FIG. 3 shows short axis slices with the determination of the center point of the heart.

FIG. 4 shows signal intensity cross-sections of the images from FIG. 3 over time to determine the position of the ventricle boundaries.

FIG. 5 schematically illustrates a method to determine the rest phase in the heart via formation of difference images.

DESCRIPTION OF THE PREFERRED EMBODIMENTS

FIG. 1 schematically shows a magnetic resonance system 10 with which the time spans of the rest phase of the cardiac cycle can be automatically determined. The magnetic resonance system has a basic field magnet 11 to generate a polarization field $B_0$. An examination person 12 on a bed 13 is slid into the magnet, whereby a resulting magnetization is generated in the examination person. Furthermore, gradient coils (not shown) are provided in the magnet to generate a gradient field, and RF coils are provided to radiate RF pulses. As is sufficiently known to the man skilled in the art in the field of magnetic resonance tomography, measurement signals are acquired in chronological order via switching of RF pulses in connection with gradients, which measurement signals are converted into an MR image via post-processing in a control device 14. The control device 14 has an image acquisition unit 15 with which an operator can input the imaging parameters such as acquisition time, echo time, size of the field of view etc. via an input unit (not shown). The image acquisition unit then controls the switching of the gradient and RF pulses in the time sequence. The calculated MR images can be presented on a display unit 16. Furthermore, a calculation unit 17 is provided with the aid of which the rest phase of the heart can be automatically calculated. A control unit 18 controls the workflow as a whole. The general functionality of an MR system is known to those skilled in the art, such that a more detailed description of the parts that are not essential to the invention can be foregone for clarity.

With the use of the MR system, MR images of the examination person can now be acquired in a short axis slice in a technique that enables a number of images to be acquired during a cardiac cycle of approximately one second. Two MR images 21, 22 are presented in FIG. 2 that show a short axis slice through the heart. In the acquired short axis slices, the volume of a predetermined region (for example the endocardial region) can be examined. For this the endocardial region is determined in the MR image via semi-automatic or automatic segmentation. The volume of the endocardial region can be concluded from the area shown in the various short axis slices. The volume of the endocardial region as it was calculated from the acquired MR images is presented in the graph 24 in FIG. 2. As is recognizable in the graph 24, the endocardial volume decreases during the contraction of the systole while it increases again in the diastolic phase. In the graph from FIG. 2, the two points in time t1 and t2 between which the endocardial volume remains essentially constant are additionally charted. These points in time t1 and t2 define the rest phase of the heart. Precisely the time span during which the subsequent imaging sequence should proceed can be identified in the cardiac cycle from the points in time t1 and t2 at which the corresponding MR images were acquired. For example, the calculation unit 17 can be fashioned such that it identifies an endocardial volume as a rest phase whose area does not change more than, for example, 5%, and that follow one another in the images over time. The automatically calculated points in time for the rest phase can be presented to the operator on the display unit 16, wherein the operator can check the starting point in time and the end point in time and change them as necessary, for example by selection of an earlier or later point in time by shifting the marking in the curve or by selecting a different image.

An addition embodiment of the invention is described in FIGS. 3 and 4. Two MR images 21, 22 are again presented in short axis slice in FIG. 3. Furthermore, the two center points 25 of the heart are presented in FIG. 3 as they were either automatically calculated by the system or as they were marked, for example by the operator. Via the determination of the center point of the heart in the various images of the cardiac cycle it is possible to post-process the images such that the center points 25 remains at an x-y coordinate in space. This means that the center point 25 does not change over time given consideration of the individual MR images. Furthermore, an intensity cross-section through the center point can be formed in the various MR images (as it is represented by the axis 26 in images 21 and 22). This intensity cross-section can now be presented shown over time as in FIG. 4, wherein in FIG. 4 the intensity cross-section in the image 27 is representative of the intensity curve over time for a specific radius starting from the center point 25. In the y-direction, the intensity cross-section is presented in FIG. 4 at a point in time; the x-axis represents this intensity cross-section at various points in time. The movement of the left ventricle 28 is well recognizable in the y-direction. In the method presented in FIG. 4, the position of the left ventricle is now examined. In the event that the position of the ventricle is constant over a longer time period, the rest phase in the cardiac cycle can be concluded. For example, the inner boundaries of the left ventricle can be determined by post-processing of the calculated image 27, wherein given these inner boundaries a straight-line curve is detected as it is represented by the two curves 29 when the heart is at rest. The image that belongs to the intensity cross-section at the left and right ends of the curve 29 in turn forms the starting point in time and the end point in time for the rest phase in the cardiac cycle or, respectively, was acquired at these points in time. These are represented by the two markings 30, 31 in the right image 27. The images that belong to the markings 30, 31 can then be displayed to the operator, wherein the operator gain checks the starting and end points in time of the rest phase and can modify them as needed by displacing the markings 30, 31 via selection of an earlier or later image.

An additional possibility for automatic determination of the rest phase of the heart is shown in FIG. 5. For this the respective images of the short axis slices that are acquired in succession are subtracted from one another. For example, the second image is subtracted from the first and the third from the second etc. This then leads to the difference images 32, 33 and 34 from FIG. 5. As is recognizable from the images 1 and 2 in FIG. 5, here the movement of the heart is relatively large, such that heart contours are relatively well recognizable in the difference image and overall a great many difference signal intensities are present. This likewise applies for the image 33 which shows the difference of the second and third images. In the difference image 34 which shows the difference of the 19th and 20th images, however, the movement between the 19th image and 20th image is so slight that overall the heart contour is no longer recognizable in the difference image 34. The rest phase in the heart can thus likewise be concluded via analysis of the difference images. For example, it is possible to map the sum of the image point intensities in a predetermined region within the difference image and to check whether this is less than a predetermined threshold. Naturally, other post-processing possibilities are also conceivable, for example checking whether the heart contour is still recognizable or not in the subtracted images. The images that were acquired during the rest phase of the heart can again be concluded from the difference images in which the signal lies below a threshold. The starting and end points in time of the rest phase can again be displayed to the operator, which can change the starting and end points in time as necessary.

The established time spans of the rest phase of the heart can then be automatically integrated into the subsequent measurement. For this it is necessary to adapt some parameters to the duration of the rest phase. These parameters can be provided in the follow-up measurement with start values that are then automatically adapted by the system. Possible values that can be adapted are, for example, the acquisition window which typically defines the time spans in the EKG signal during which the signal acquisition ensues. A trigger delay can likewise be automatically set which initiates the start of the image acquisition after the R-spike in the EKG signal. In segmented measurement techniques, the number of the segments can likewise be adapted under consideration of the duration of the rest phase of the heart so that this time span can be optimally used for data acquisition. In procedures known as single shot measurement techniques in which the entire raw data space is measured during a rest phase, it can occur that the rest phase of the heart is shorter than the acquisition duration necessary in order to fill the entire raw data space in one heartbeat. If this should be the case, the operator can be informed of this fact and receives the possibility to use other measurement parameters (for example by reducing the spatial resolution, limiting the field of view, etc.) so that the entire MR image can be acquired in one rest phase.

The three possibilities described above can likewise be combined in order to improve the automatic detection of the rest phase.

Although modifications and changes may be suggested by those skilled in the art, it is the intention of the inventors to embody within the patent warranted hereon all changes and modifications as reasonably and properly come within the scope of their contribution to the art.

The invention claimed is:

1. A method for automatically determining a rest phase of a heart of an examination subject in an imaging device, comprising the steps of:
with said imaging device, acquiring a plurality of successive images of the heart, each from the same, single image perspective, during a cardiac cycle;
supplying said plurality of images to a processor and, in said processor, automatically determining the rest phase of the heart by post-processing the plurality of images in said processor; and
in said post-processing of said plurality of images in said processor, automatically determining the rest phase of the heart by determining whether a spatial position of a ventricle boundary of the heart remains substantially constant in said plurality of images over time by analyzing a one-dimensional signal intensity cross-section through each of said plurality of images over time, each cross-section containing said ventricle boundary and each cross-section being oriented so that a position coinciding with the center of the heart is substantially constant therein, and by determining whether the position of said ventricle boundary remains substantially constant in said cross-section over time, and identifying respective images in said plurality of images in which the ventricle boundary is substantially constant in said cross-section over time as being images acquired during the rest phase of the heart.

2. A method as claimed in claim 1 comprising, in said post-processing in said processor, automatically identifying a start image that shows a starting point in time of the rest phase of the cardiac cycle and an end image that shows an end point in time of the rest phase of the cardiac cycle, from among said plurality of images, and identifying respective points in time that demarcate the rest phase of the heart in the cardiac cycle from the start image and the end image.

3. A method as claimed in claim 1 comprising automatically transferring the rest phase of the heart determined in said processor to a controller for said imaging device and, in said controller, automatically adapting a subsequent imaging sequence for operating said imaging device to acquire images in said imaging sequence during said rest phase of the heart.

4. A method as claimed in claim 1 comprising employing a magnetic resonance imaging system as said imaging device.

5. A method as claimed in claim 3 comprising adapting a characteristic of said imaging sequence, dependent on said rest phase, selected from the group consisting of data acquisition window, trigger delay, and number of images acquired during said rest phase.

6. A method as claimed in claim 1 comprising acquiring said images of the heart in said imaging device along a short axis slice of the heart.

7. A method as claimed in claim 1 comprising, in said post-processing of the images in said processor, identifying a volume parameter of the heart from said images over time, and identifying time spans in which said volume parameter remains substantially constant in said images over time as said rest phase.

8. A method as claimed in claim 7 comprising employing a volume of the endocardio region of the heart as said volume parameter.

9. A method as claimed in claim 8 comprising determining said volume parameter by analyzing an area of the endocardio region over time in said plurality of images.

10. A method as claimed in claim 1 comprising from said images in which the ventricle boundary is substantially constant, identifying a starting point in time and an ending point in time of the rest phase.

11. . A method as claimed in claim 1 comprising in said post-processing of said plurality of images in said processor, automatically determining the rest phase in the cardiac cycle by forming a difference between selected images in said plurality of images.

12. A method as claimed in claim 11 comprising determining said difference from successive images in said plurality of images.

13. A method as claimed in claim 12 comprising identifying two successive images as having occurred during said rest phase when a signal intensity in a predetermined region in said difference image is less than a predetermined limit value.

14. An imaging device for automatically determining a rest phase of a heart of an examination subject, comprising:
   an image acquisition system that acquires a plurality of successive images of the heart, each from the same, single image perspective, during a cardiac cycle;
   a processor supplied with said plurality of images, said processor being configured to automatically determine the rest phase of the heart by post-processing the plurality of images; and
   said processor being configured to post-process said plurality of images to automatically determine the rest phase of the heart by determining whether a spatial position of a ventricle boundary of the heart remains substantially constant in said plurality of images over time by analyzing a one-dimensional signal intensity cross-section through each said plurality of images over time, each cross-section containing said ventricle boundary and each cross-section being oriented so that a position coinciding with the center of the heart is substantially constant therein, and by determining whether the position of said ventricle boundary remains substantially constant in said cross-section over time and identifying respective images in said plurality of images in which the ventricle boundary is substantially constant in said cross-section over time as being images acquired during the rest phase of the heart.

15. A non-transitory computer-readable data storage medium encoded with programming instructions, said data storage medium being loaded into a processor supplied with a plurality of images of the heart of an examination subject in an imaging device, successively acquired with said imaging device, each from the same, single image perspective during a cardiac cycle, said programming instructions causing said processor to post-process said plurality of images to:
   automatically determine the rest phase of the heart by determining whether a spatial position of a ventricle boundary of the heart remains substantially constant in said plurality of images over time by analyzing a one-dimensional signal intensity cross-section through each of said plurality of images over time, each cross-section containing said ventricle boundary and each cross-section being oriented so that a position coinciding with the center of the heart is substantially constant therein;
   determine whether the position of said ventricle boundary remains substantially constant in said cross-section over time by arranging said plurality of images to cause said position of said ventricle boundary to be substantially constant over time by arranging said images so that a position coinciding with the center of the heart, and thus said ventricle boundary as well, is substantially constant in the plurality of images over time; and
   identify respective images in said plurality of images in which the ventricle boundary is substantially constant in said cross-section over time as being images acquired during the rest phase of the heart.

* * * * *